(12) United States Patent
Aihara

(10) Patent No.: US 7,518,150 B2
(45) Date of Patent: Apr. 14, 2009

(54) WHITE LIGHT SOURCE AND ILLUMINATION APPARATUS USING THE SAME

(75) Inventor: Kenshi Aihara, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 11/367,019

(22) Filed: Mar. 3, 2006

(65) Prior Publication Data

US 2006/0197098 A1 Sep. 7, 2006

(30) Foreign Application Priority Data

Mar. 7, 2005 (JP) .............................. 2005-061706

(51) Int. Cl.
*H01L 33/00* (2006.01)
(52) U.S. Cl. .............................. 257/79; 257/13; 257/80; 257/103; 257/90; 257/E51.018; 257/E33.001; 257/E33.054
(58) Field of Classification Search ................... 257/13, 257/79–103, E51.018, E33.001, E33.054
See application file for complete search history.

(56) References Cited

U.S. PATENT DOCUMENTS

| 6,415,531 | B1 * | 7/2002 | Ohtsuki et al. | 36/31 |
| 7,049,159 | B2 * | 5/2006 | Lowery | 438/22 |
| 2003/0038295 | A1 * | 2/2003 | Koda | 257/98 |
| 2004/0012027 | A1 * | 1/2004 | Keller et al. | 257/79 |
| 2004/0256626 | A1 * | 12/2004 | Wang et al. | 257/89 |
| 2006/0197432 | A1 * | 9/2006 | Nagatomi et al. | 313/487 |

FOREIGN PATENT DOCUMENTS

JP 2001-144331 5/2001
JP 2004-127968 4/2004

* cited by examiner

*Primary Examiner*—Wai-Sing Louie
*Assistant Examiner*—Marc Armand
(74) *Attorney, Agent, or Firm*—Browdy and Neimark, P.L.L.C.

(57) ABSTRACT

A light emitting device including a blue-system semiconductor light emitting element, a green-system semiconductor light emitting element, a yellow fluorescent member which absorbs a part of blue light from the blue-system semiconductor light emitting element and emits yellow-system light as excitation light, and a red fluorescent member which absorbs a part of green light from the green-system semiconductor light emitting element and emits red-system light as excitation light.

15 Claims, 4 Drawing Sheets

WHITE LIGHT SOURCE AND ILLUMINATION APPARATUS USING THE SAME

CROSS-REFERENCE TO THE RELATED APPLICATION

This application is based on and claims priority from Japanese Patent Application No. 2005-61706, filed on Mar. 7, 2005, the disclosure of which is incorporated herein by reference in its entirety.

BACKGROUND OF THE INVENTION

1. Field of the Invention

The present invention relates to a light emitting device and an illumination apparatus using the light emitting device.

2. Description of Related Art

In recent years, a light emitting diode (LED) device configured to emit white-system light by a combination of a blue LED element and a yellow fluorescent member having a complementary chromatic relationship to blue light emitted from the blue LED element, has been marketed as a package with a high light intensity.

However, there is a problem that the LED device has low color rendering properties and color rendering properties show an index representing the naturalness of color obtained when illuminating. That is to say, because both green and red spectrum components are not included or sufficient in the combination of the blue LED element and the yellow fluorescent member, it has not been possible to obtain sufficient color rendering properties for a backlight of a liquid crystal display, light source for illumination, or the like.

Therefore, what has conventionally been proposed is a light emitting device which is configured to emit the three primary colors and improve the color rendering properties by dispersing both a green fluorescent material 3 and a red fluorescent material 4 in a sealing body 2 covering a blue LED element 1, as shown, for example, in FIG. 7A (see, for reference, Japanese Patent Laid-Open No. 2001-144331, claims and FIG. 13).

There has also been proposed a light emitting device which is configured to emit the three primary colors and improve the color rendering properties by dispersing each of a blue fluorescent material 7, a green fluorescent material 3 and a red fluorescent material 4 in a sealing body 6 covering an ultraviolet LED element 5, as shown, for example, in FIG. 7B (see, for reference, Japanese Patent Laid-Open No. 2004-127988, claims and FIG. 2).

However, the following problems may be experienced with the above-mentioned light emitting devices.

The conventional light emitting devices including the combination of a single color LED element such as the blue LED element 1 or ultraviolet LED element 5 and a plurality of fluorescent material such as the blue, green and red fluorescent material 3, 4, 7 and configured to obtain the three primary colors have sufficient color rendering properties, but have low emission efficiency making it difficult to obtain the required light intensity.

In other words, the plurality of the fluorescent material having different colors must be excited by a single color of the single LED element. Accordingly, a high brightness is required for light emitted from the single LED element. In addition, because each of the fluorescent material has a different emission efficiency with respect to the single color of light, it is not possible to obtain sufficient light intensity and good color rendering properties for the light emitting device.

SUMMARY OF THE INVENTION

An object of the present invention is to provide a light emitting device capable of producing white light having high light intensity and improved color rendering properties, and an illumination apparatus using the light emitting device.

To accomplish the above-mentioned object, a light emitting device according to one embodiment of the present invention includes a blue-system semiconductor light emitting element, a green-system semiconductor light emitting element, a yellow fluorescent member, and a red fluorescent member.

The yellow fluorescent member is configured to absorb a part of the blue light from the blue-system semiconductor light emitting element as excitation light and emit yellow-system light.

The red fluorescent member is configured to absorb a part of the green light from the green-system semiconductor light emitting element as excitation light and emit red-system light.

DETAILED DESCRIPTION OF THE PREFERRED EMBODIMENTS

Preferred embodiments of the present invention will be explained in detail below with reference to the accompanying drawings.

Figure 1:
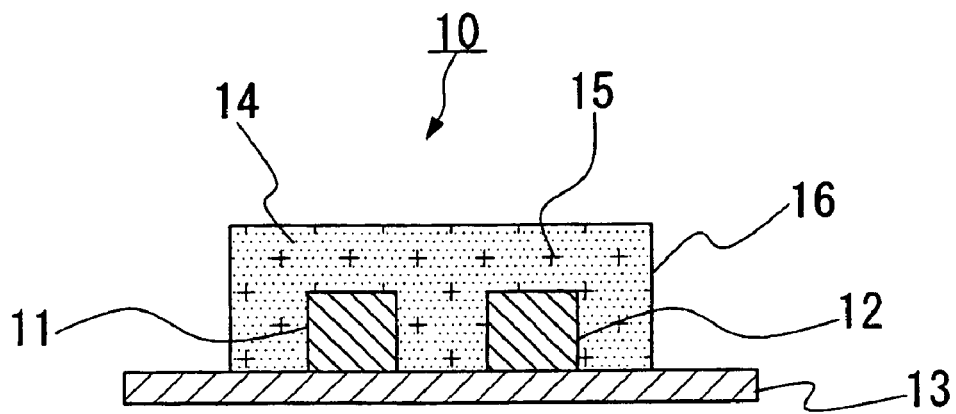
FIG. 1 is a schematic sectional view showing a first embodiment of a light emitting device according to the present invention.

FIG. 1 illustrates a first embodiment of a light emitting device according to the present invention.

As shown in FIG. 1, the light emitting device 10 in the first embodiment includes a substrate 13, a blue LED element (blue-system semiconductor light emitting element) 11, a green LED element (green-system semiconductor light emitting element) 12, and a yellow-red resinous sealing body 16 attached to the substrate 13 to cover the blue and green LED elements 11 and 12 together.

Here, the blue LED element 11 and the green LED element 12 are adhesively mounted on one surface, for example, an upper surface of the substrate 13 by, for example, Ag paste or the like.

In this first embodiment, the yellow-red resinous body 16 comprises a yellow fluorescent member including yellow-system fluorescent particles 14 and a red fluorescent member including red-system fluorescent particles 15. The yellow fluorescent particles 14 and red fluorescent particles 15 are integrally formed in the yellow-red resinous sealing body (see FIG. 1).

The blue LED element 11 has a high luminescent efficiency and utilizes an InGaN-system compound semiconductor having a luminescent wave length range of, for example, 470 to 490 nm. The green LED element 12 has a high luminescent efficiency and utilizes an InGaN-system or GaP-system compound semiconductor having a luminescent wave length range of, for example, 490 to 520 nm.

The substrate 13 has, for example, a generally cuboid-like shape in top plan view and is an insulative substrate made of glass epoxy resin, BT resin, ceramic, metal core, or the like. The substrate 13 includes electrode patterns (not shown) formed on the upper surface thereof to electrically connect the LED elements to a motherboard of an outer device (not shown).

Although electric connection between each of the blue LED element 11 and the green LED element 12, and the substrate 13 is not shown in the drawings, electrodes of each of the blue and green LED elements 11 and 12 are electrically connected to the electrode patterns formed on the surface of the substrate 13 through a conductive adhesive material such as Ag paste, or the like, and bonding wires.

The yellow fluorescent particles 14 absorb a part of the blue light emitted from the blue LED element 11 and emit yellow-system light as excitation light. For example, fluorescent particles contained in materials such as YAG (yttrium aluminum garnet)-system, terbium-system, strontium-system, phosphate-system, silicate-system, aluminate-system or the like may be used to emit yellow light.

Also, the red fluorescent particles 15 absorb a part of the green light emitted from the green LED element 12 and emit red-system light as excitation light. For example, $CaAlSiN_3$ (three-nitrides of calcium, aluminum, silicon) fluorescent material in which $Eu^{2+}$ (europium) is solid-solved, or the like, may be used to emit red light.

Yttrium oxide-based red fluorescent particles which are well known for their use in cathode-ray tubes emit light efficiently by irradiation of an electron beam or ultraviolet, but emit almost no light by irradiation of visible light. However, the $CaAlSiN_3$ fluorescent material in which $Eu^{2+}$ is solid-solved emit red light of an emission intensity similarly high to that produced by the above mentioned red fluorescent particles when irradiated by ultraviolet, even with respect to excitation light in the blue to green visible spectrum range, and act as suitable red fluorescent material for this embodiment.

The yellow-red resinous sealing body 16 containing the yellow fluorescent particles and the red fluorescent particles together is formed by a transparent resin such as epoxy resin, silicon resin, or the like. The yellow-red resinous sealing body 16 is molded in a generally cuboid-like shape or elongate cylindrical shape having a rounded end, according to the application.

In this first embodiment, by emitting blue light from the blue LED element 11, yellow light from the yellow fluorescent particles 14, green light from the green LED element 12, and red light from the red fluorescent particles 15, respectively, it is possible to obtain the three primary colors of light (R, G, and B) together with yellow which is in a complementary color relationship to blue, thereby assuring excellent color rendering properties for the light emitting apparatus. In addition, by exciting the yellow fluorescent particles 14 and the red fluorescent particles 15 by light from the blue LED element 11 and light from the green LED element 12, a high emission intensity can be acquired, and the color rendering properties and color temperature can be controlled by adjusting the emission intensity of each of the blue LED element 11 and the green LED element 12.

Figure 2:
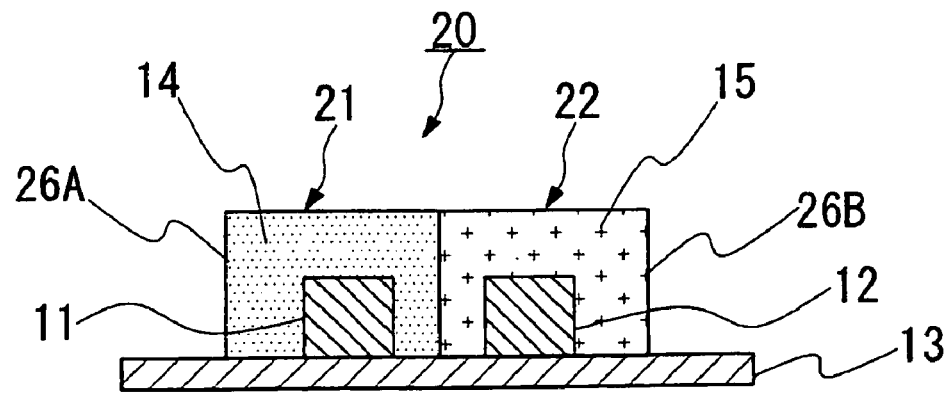
FIG. 2 is a schematic sectional view showing a second embodiment of the light emitting device according to the present invention.

Next, a second embodiment of the light emitting device according to the present invention is explained referring to FIG. 2.

In the embodiments mentioned hereinafter, the same reference numbers are attached to parts identical to those in the above-mentioned first embodiment and a description of said identical parts is omitted.

The light emitting device 20 in the second embodiment differs from the light emitting device 10 in the above-mentioned first embodiment in the following point.

That is to say, in the light emitting device 10 in the first embodiment, the blue LED element 11 and the green LED element 12 are covered by the yellow-red resinous sealing body 16 which contains the yellow fluorescent particles 14 and the red fluorescent particles 15 and is integrally formed.

In contrast, the light emitting device 20 in the second embodiment includes a blue-yellow light emitting section 21 which has a yellow resinous sealing body 26A with which the blue LED element 11 is covered and a red-green light emitting section 22 which has a red resinous sealing body 26B with which the green LED element 12 is covered (see FIG. 2). Yellow fluorescent particles are dispersed in the yellow resinous sealing body 26A and red fluorescent particles are dispersed in the red resinous sealing body 26B.

In other words, in the light emitting device 20 in the second embodiment, the yellow fluorescent particles 14 are contained in the yellow resinous sealing body 26A, and the red fluorescent particles 15 are contained in the red resinous sealing body 26B. The yellow resinous sealing body 26A and the red resinous sealing body 26B are disposed to be in contact with each other.

When the blue LED element 11 and the green LED element 12 are covered together by the one yellow-red resinous sealing body 16, as shown in FIG. 1, a part of the light emitted from the blue LED element 11 and a part of the light emitted from the green LED element 12 excite the yellow fluorescent particles 14 and the red fluorescent particles 15 disposed in the yellow-red resinous sealing body 16 together.

On the contrary, in the light emitting device 20 in the second embodiment, the yellow fluorescent particles 14 and the red fluorescent particles 15 are excited independently by the blue light from the blue LED element 11 and the green light from the green LED element 12.

Subsequently, a third embodiment and a fourth embodiment of the light emitting device according to the present invention are explained below referring to FIGS. 3 and 4.

Figure 3:
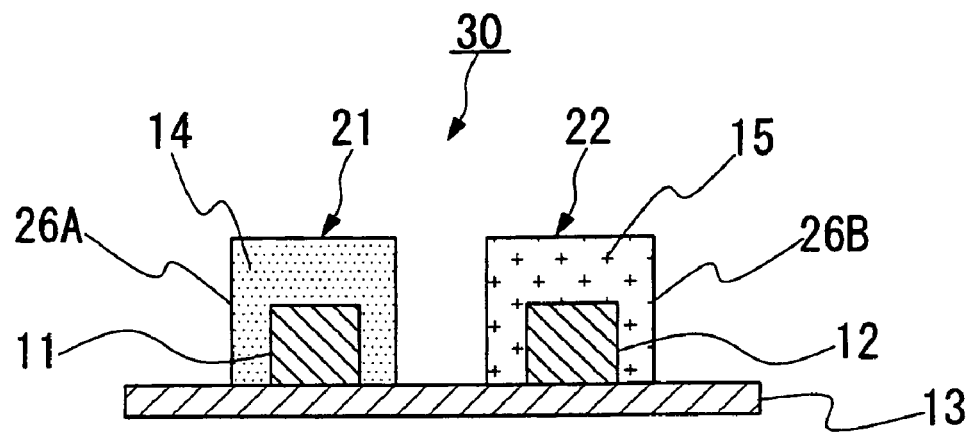
FIG. 3 is a schematic sectional view showing a third embodiment of the light emitting device according to the present invention.
Figure 4:
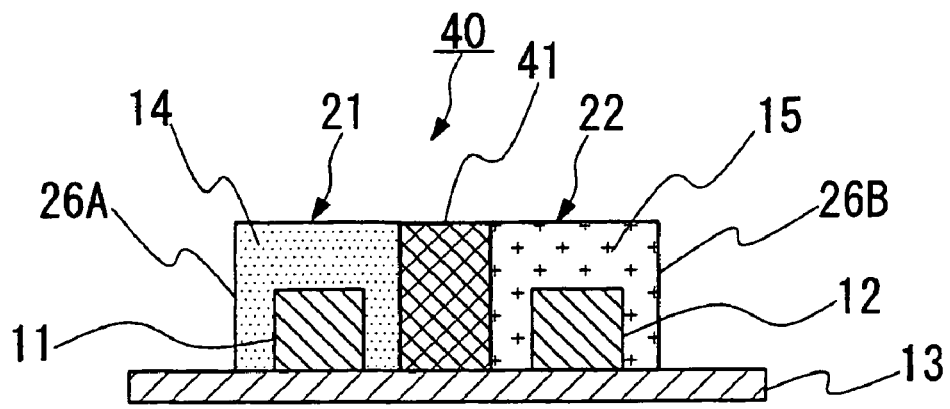
FIG. 4 is a schematic sectional view showing a fourth embodiment of the light emitting device according to the present invention.

The light emitting device 30 in the third embodiment differs from the light emitting device 20 in the second embodiment in that the blue-yellow light emitting section 21 and the red-green light emitting section 22 are disposed at a predetermined interval, as shown in FIG. 3.

In the light emitting device 30 in the third embodiment, because the blue-yellow light emitting section 21 and the red-green light emitting section 22 are disposed at the predetermined interval, it is possible to prevent obscuring of light emitted from one of the blue-yellow light emitting section 21 and red-green light emitting section 22 by light from the other of the blue-yellow light emitting section 21 and red-green light emitting section 22.

On the other hand, the light emitting device 40 in the fourth embodiment differs from the light emitting device 30 in the third embodiment in that the blue-yellow light emitting section 21 and the red-green light emitting section 22 are disposed interposing a light-shielding partition 41.

That is to say, in the light emitting device 30 in the third embodiment, the interval is established between the blue-yellow light emitting section 21 and the red-green light emitting section 22.

In contrast, in the light emitting device 40 in the fourth embodiment, the blue-yellow light emitting section 21 and the red-green light emitting section 22 are optically separated by the partition 41.

In the fourth embodiment, because the blue-yellow light emitting section 21 and the red-green light emitting section 22 are separated optically by the partition 41, it is possible to block entrance of light from one of the blue-yellow light emitting section 21 and red-green light emitting section 22 to the other thereof.

As a result, it is possible to prevent the light excited by one type of particle from colliding with another type of particle, resulting in deteriorating light efficiency.

The partition 41 is made of, for example, plastic material, metallic material, or the like. If a reflective surface is provided on a surface and at least on a surface which has contact with each of resinous sealing bodies, stronger emission intensity can be obtained for the light emitting device 40. Here, the reflective surface is formed by a mirror-finished surface or reflective film.

Next, a fifth embodiment and a sixth embodiment of the light emitting device according to the present invention are explained below referring to FIGS. 5 and 6.

Figure 5:
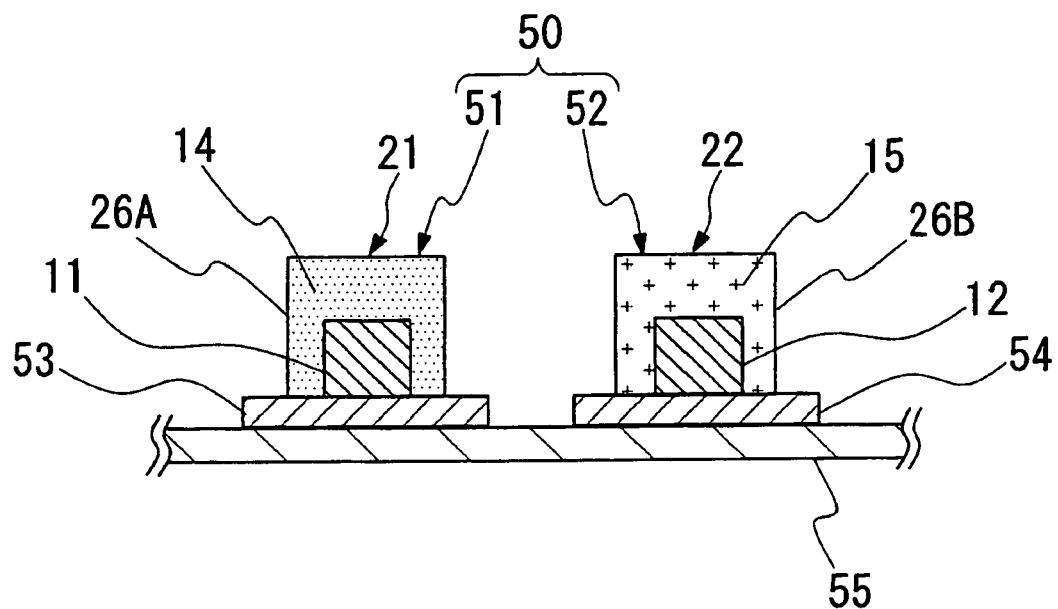
FIG. 5 is a schematic sectional view showing a fifth embodiment of the light emitting device and an illumination apparatus according to the present invention.

The light emitting device 50 in the fifth embodiment differs from the light emitting device 30 in the third embodiment in that the blue-yellow light emitting section 21 and the red-green light emitting section 22 are mounted on a blue-yellow substrate 53 and a red-green substrate 54, respectively, and the blue-yellow substrate 53 and the red-green substrate 54 are mounted on a mother board (circuit board) 55, as shown in FIG. 5.

More specifically, in the light emitting device 30 in the third embodiment, the blue-yellow light emitting section 21 and the red-green light emitting section 22 are mounted on one substrate 13, as shown in FIG. 3.

In contrast, the light emitting device 50 in the fifth embodiment includes a blue-yellow package 51 in which the blue-yellow light emitting section 21 is mounted on the blue-yellow substrate 53 and a red-green package 52 in which the red-green light emitting section 22 is mounted on the red-green substrate 54 (see FIG. 5). As mentioned above, the blue-yellow substrate 53 and the red-green substrate 54 are mounted on the mother board 55.

Meanwhile, the blue-yellow substrate 53 and the red-green substrate 54 have, for example, a generally cuboid-like shape and are formed from an insulative substrate such as a glass epoxy substrate, BT resinous substrate, ceramic substrate, metal core substrate, or the like.

Electrode patterns (not shown) for connection to the mother board 55 are provided on the blue-yellow substrate 53 and the red-green substrate 54, respectively. Circuit patterns (not shown) configured for connection to the electrode patterns of each of the blue-yellow substrate 53 and the red-green substrate 54 are provided on at least one surface of the mother board 55 on which the blue-yellow substrate 53 and the red-green substrate 54 are mounted.

It should be noted that the fifth embodiment forms an illumination apparatus including the mother board 55 and the light emitting device 50 which comprises the blue-yellow package 53 and the red-green package 54 and is mounted on the mother board 55.

In this way, in the fifth embodiment, because the light emitting device 50 having a high light intensity and color rendering properties is mounted on the mother board 55, it is possible to enhance light efficiency as a backlight for a liquid crystal display or an illumination light source in various devices, and in addition, when illuminating, it is possible to achieve adjustment of the color rendering properties and color temperature.

Figure 6:
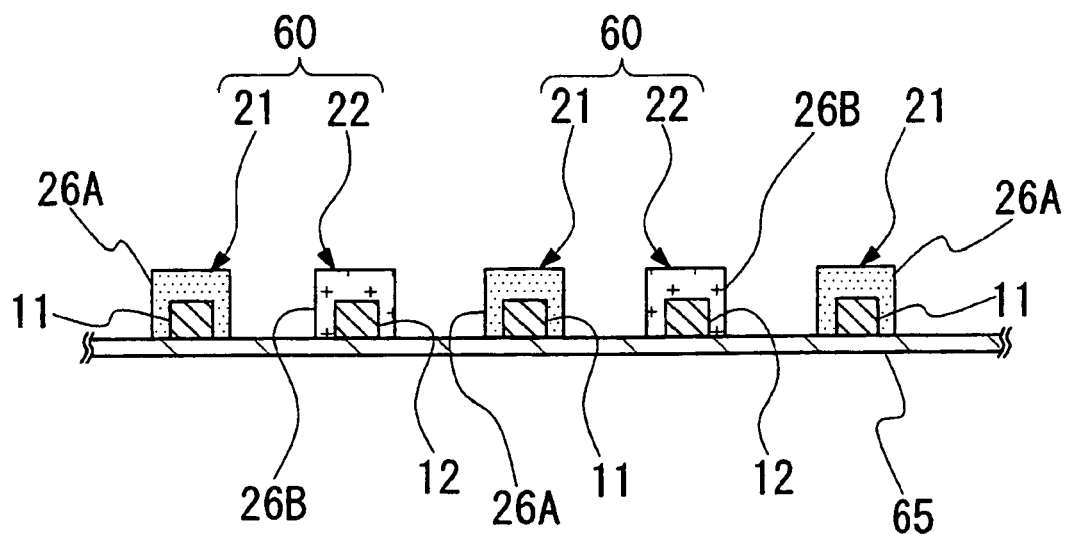
FIG. 6 is a schematic sectional view showing a sixth embodiment of the light emitting device and the illumination apparatus according to the present invention.
Figure 7A:
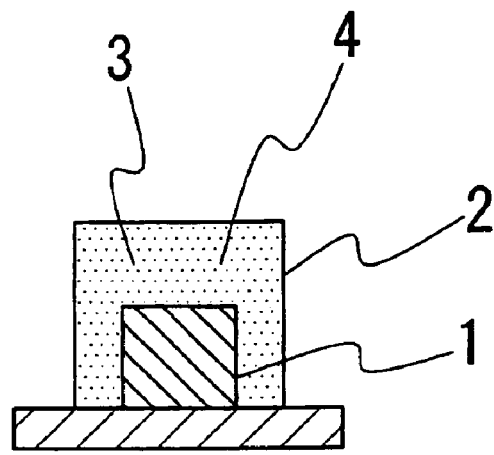
FIG. 7A is a schematic sectional view showing one example of a conventional light emitting device.
Figure 7B:
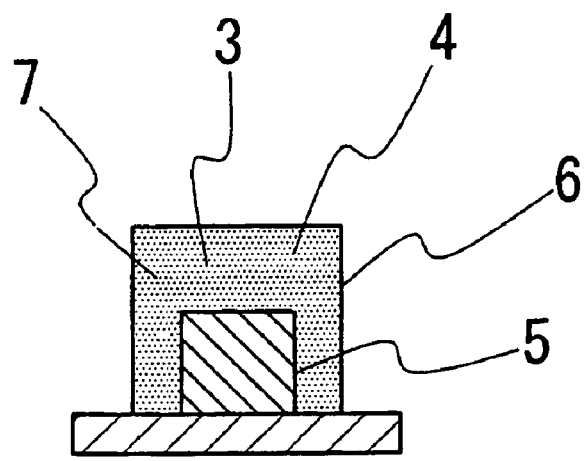
FIG. 7B is a schematic sectional view showing another example of a conventional light emitting device.

The sixth embodiment differs from the fifth embodiment in that a plurality of light emitting devices 60 or circuit boards are mounted on a mother board 65 directly, as shown in FIG. 6.

More specifically, in the light emitting device 50 in the fifth embodiment, the blue-yellow package 51 in which the blue-yellow light emitting section 21 is mounted on the blue-yellow substrate 53 and the red-green package 52 in which the red-green light emitting section 22 is mounted on the red-green substrate 54 are side-by-side mounted on the mother board 55.

In contrast, in the sixth embodiment, the plurality of light emitting devices 60 are disposed at intervals on a mother board 65 (see FIG. 6). Each of the plurality of light emitting devices includes the blue-yellow light emitting section 21 and the red-green light emitting section 22, as mentioned in the embodiments.

Electrode pads (not shown) and circuit patterns (not shown) which are electrically connected to the blue LED element 11 and the green LED element 12 through a conductive material such as Ag paste or the like and bonding wires are provided on the mother board 65.

In the sixth embodiment, because the plurality of light emitting devices 60 are mounted on the mother board 65 in an array, it is possible to provide a light source suitable for a backlight of a liquid crystal display requiring high brightness over a wide area.

The present invention is not limited to the above-mentioned embodiments, and various modifications and changes can be applied to these embodiments. For example, in the above-mentioned embodiments, a blue LED element 11 and green LED element 12 are used, but instead of using these kinds of LED elements, a blue LD (semiconductor laser) and green LD may be used.

Moreover, the light emitting devices 10, 20, 30, 40, 50 and 60 in the above-mentioned embodiments and the illumination apparatus using them may be applied to the illumination of a light guiding panel for a relatively small liquid crystal display used in a mobile phone, a relatively large liquid crystal display, a backlight unit in a meter, indicator, and so on, or apparatuses for lighting.

As mentioned above, in the light emitting device according to the present invention, it is possible to emit blue light from the blue-system semiconductor light emitting element, yellow light from the yellow fluorescent particles, green light from the green-system semiconductor light emitting element, and red light from the red fluorescent particles.

Consequently, it is possible to obtain the three primary colors of red (R), green (G) and blue (B) together with yellow which is in a complementary color relationship to blue, thus assuring improved color rendering properties. In addition, it is possible to obtain a high light intensity by exciting the fluorescent particles through the two semiconductor light emitting elements such as two LEDs, and adjust the color rendering properties and color temperature through adjustment of the emission intensity of each of the two semiconductor light emitting elements.

In the illumination apparatus according to the present invention, because the above-mentioned light emitting device is mounted on the circuit board, it is possible to provide white light illumination with improved color rendering properties as an illumination light source or backlight of a liquid crystal display in various devices and adjust the color rendering properties or color temperature during illumination.

Although the preferred embodiments of the present invention have been mentioned, the present invention is not limited to these embodiments, and various modifications and changes can be made to the embodiments.

What is claimed is:

1. A white light source comprising:
   a blue-yellow light-emitting section including a blue-system semiconductor light-emitting element and a sealing resin sealing the blue-system semiconductor light-emitting element, the sealing resin containing a yellow fluorescent member and being configured to emit yellow-system light by absorbing a part of blue light emitted from the blue-system semiconductor light-emitting element;
   a red-green light-emitting section including a green-system semiconductor light-emitting element and a sealing resin sealing the green-system semiconductor light-emitting element, the sealing resin containing a red fluorescent member and being configured to emit red-system light by absorbing a part of green light emitted from the green-system semiconductor light-emitting element; and
   a circuit board on which the blue-yellow light-emitting section and the red-green light-emitting section are adjacently disposed as independent sections.

2. The white light source according to claim 1,
   wherein the blue-yellow light-emitting section and the red-green light emitting section are disposed. side-by-side with opposing side surfaces of the blue-yellow light-emitting section and the red-green light-emitting section in contact with each other.

3. The white light source according to claim 1,
   wherein the blue-yellow light-emitting section and the red-green light-emitting section are disposed with a predetermined interval between opposing side surfaces of the blue-yellow light-emitting section and the red-green light-emitting section.

4. The white light source according to claim 1,
   wherein the blue-yellow light-emitting section and the red-green light-emitting section are disposed with a light-shielding partition interposed between opposing side surfaces of the blue-yellow light-emitting section and the red-green light-emitting section.

5. The white light source according to claim 1,
   wherein the red fluorescent member includes $CaAlSiN_3$ fluorescent particles in which $Eu^{2+}$ is solid-solved.

6. An illumination apparatus comprising:
   the white light source recited in claim 1; and
   a circuit board on which the white light source is mounted.

7. An illumination apparatus comprising:
   a plurality of white light sources, each of which is according to claim 1; and
   a circuit board on which the plurality of the white light sources are mounted.

8. The white light source according to claim 1,
   wherein the blue-system semiconductor light-emitting element is covered only by the sealing resin containing the yellow fluorescent member, and the green-system semiconductor light-emitting element is covered only be the sealing resin containing the red fluorescent member.

9. A white light source comprising:
   a blue-yellow light-emitting section including a blue-system semiconductor light-emitting element and a sealing resin sealing the blue-system semiconductor light-emitting element, the sealing resin containing a yellow fluorescent member and being configured to emit yellow-system light by absorbing a part of blue light emitted from the blue-system semiconductor light-emitting element;
   a red-green light-emitting section including a green-system semiconductor light-emitting element and a sealing resin sealing the green-system semiconductor light-emitting element, the sealing resin containing a red fluorescent member and being configured to emit red-system light by absorbing a part of green light emitted from the green-system semiconductor light-emitting element;
   a circuit board on which the blue-yellow light-emitting section and the red-green light-emitting section are adjacently disposed as independent sections,
   wherein the only sealing resin that covers said blue-system semiconductor light-emitting element is said sealing resin that contains a yellow fluorescent member and the only sealing resin that covers said green-system semiconductor light-emitting element is said sealing resin that contains a red fluorescent member.

10. The white light-source according to claim 9;
    wherein the blue-yellow light-emitting section and the red-green light emitting section are disposed side-by-side with opposing side surfaces of the blue-yellow light-emitting section and the red-green light-emitting section in contact with each other.

11. The white light source according to claim 9,
    wherein the blue-yellow light-emitting section and the red-green light-emitting section are disposed with a predetermined interval between opposing side surfaces of the blue-yellow light-emitting section and the red-green light-emitting section.

12. The white light source according to claim 9,
    wherein the blue-yellow light-emitting section and the red-green light-emitting section are disposed with a light-shielding partition interposed between opposing side surfaces of the blue-yellow light-emitting section and the red-green light-emitting section.

13. The white light source according to claim 9,
    wherein the red fluorescent member includes $CaAlSiN_3$ fluorescent particles in which $Eu^{2+}$ is solid-solved.

14. An illumination apparatus comprising:
    the white light source recited in claim 9; and
    a circuit board on which the white light source is mounted.

15. An illumination apparatus comprising:
    a plurality of white light sources, each of which is according to claim 9; and
    a circuit board on which the plurality of the white light sources are mounted.

* * * * *

UNITED STATES PATENT AND TRADEMARK OFFICE
CERTIFICATE OF CORRECTION

| | |
|---|---|
| PATENT NO. | : 7,518,150 B2 |
| APPLICATION NO. | : 11/367019 |
| DATED | : April 14, 2009 |
| INVENTOR(S) | : Kenshi Aihara |

It is certified that error appears in the above-identified patent and that said Letters Patent is hereby corrected as shown below:

Section (56) FOREIGN PATENT DOCUMENTS, document "JP 2004-127968" should be changed to --JP 2004-127988--.

At column 7, line 37, the "." after the word "disposed" should be deleted.

At column 8, line 5, the word "be" should be changed to --by--.

Signed and Sealed this
Seventh Day of June, 2011

David J. Kappos
*Director of the United States Patent and Trademark Office*